United States Patent [19]

Lenkinski et al.

[11] Patent Number: 5,435,302

[45] Date of Patent: Jul. 25, 1995

[54] FLEXIBLE SURFACE COILS FOR USE IN NUCLEAR MAGNETIC RESONANCE IMAGING

[75] Inventors: Robert E. Lenkinski, Drexel Hill; Herbert Y. Kressel, Wynnewood, both of Pa.

[73] Assignees: Medrad, Inc., Pittsburg; Trustees of the University of Pennsylvania, Philadelphia, both of Pa.

[21] Appl. No.: 124,847

[22] Filed: Sep. 22, 1993

Related U.S. Application Data

[63] Continuation of Ser. No. 854,798, Mar. 23, 1992, abandoned, which is a continuation of Ser. No. 618,527, Nov. 26, 1990, abandoned, which is a continuation of Ser. No. 477,182, Feb. 5, 1990, abandoned, which is a continuation of Ser. No. 242,479, Sep. 9, 1988, abandoned.

[51] Int. Cl.⁶ ............................................. A61B 5/055
[52] U.S. Cl. ............................... 128/653.5; 324/318; 324/322; 600/15
[58] Field of Search ..................... 128/653.2, 653.5; 324/309, 318, 322; 600/9, 10, 13-15

[56] References Cited

U.S. PATENT DOCUMENTS

| 3,915,151 | 10/1975 | Kraus | 600/13 |
|---|---|---|---|
| 4,066,065 | 1/1978 | Kraus | 600/13 |
| 4,398,149 | 8/1983 | Zens . | |
| 4,587,493 | 5/1986 | Sepponen . | |
| 4,617,936 | 10/1986 | Malko | 128/653 JC |
| 4,620,155 | 10/1986 | Edelstein . | |
| 4,636,730 | 1/1987 | Bottomley . | |
| 4,646,024 | 2/1987 | Schenck et al. . | |
| 4,649,348 | 3/1987 | Flugan . | |
| 4,680,549 | 7/1987 | Tanttu . | |
| 4,692,705 | 9/1987 | Hayes . | |
| 4,712,067 | 12/1987 | Roschmann et al. | 324/318 |
| 4,775,837 | 10/1988 | Roschmann | 324/318 |
| 4,791,372 | 12/1988 | Kirk et al. | 324/318 |
| 4,793,356 | 12/1988 | Misic et al. | 324/318 |
| 5,050,605 | 9/1991 | Eydelman et al. | 324/322 |
| 5,067,940 | 11/1991 | Liboff et al. | 600/15 |
| 5,261,403 | 11/1993 | Saito et al. | 128/653,5 |
| 5,274,332 | 12/1993 | Jaskolski et al. | 324/322 |

FOREIGN PATENT DOCUMENTS 3635006  4/1987  Germany ............................. 324/318

Primary Examiner—Lee S. Cohen
Assistant Examiner—Brian L. Casler
Attorney, Agent, or Firm—Keck, Mahin & Cate

[57] ABSTRACT

Flexible, conforming surface coils for use in nuclear magnetic resonance (NMR) imaging are disclosed. The coils comprise a flexible outer body with antennas disposed within the body. The coils closely adopt the contours and shapes of the particular part of the patient's body under observation and provide considerable comfort. Since the coils closely conform to the patient, detection of artifacts and aliasing is minimized thus providing highly resolved images of the area of the patient that is being examined. The coils are readily utilized with preexisting NMR magnets and support equipment thereby allowing efficient and cost effective NMR imaging.

13 Claims, 2 Drawing Sheets

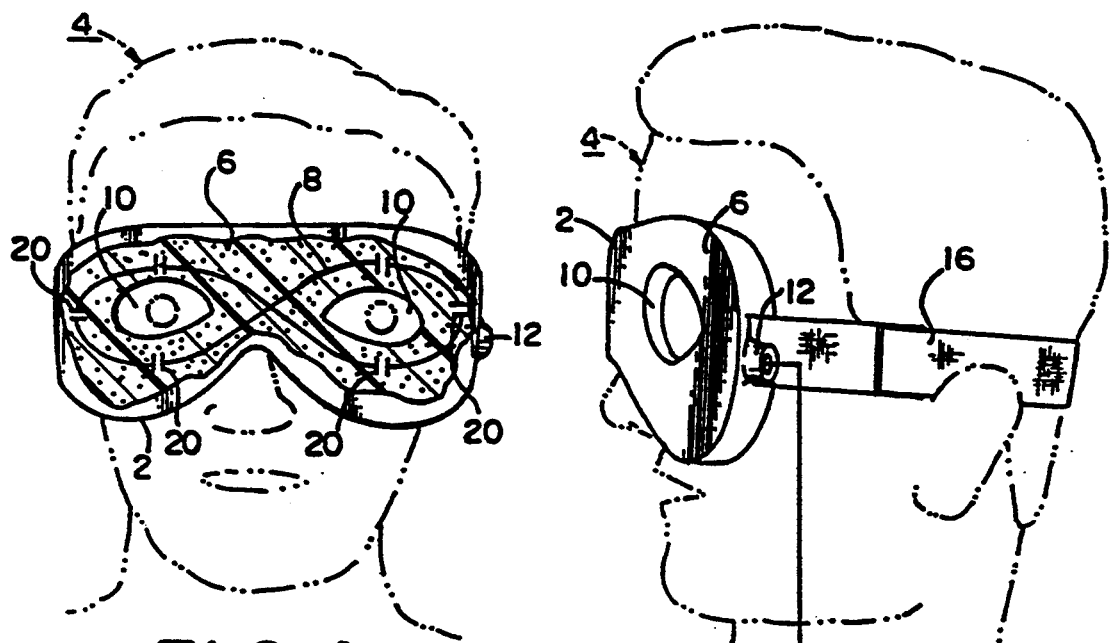
FIG. 1
FIG. 1A
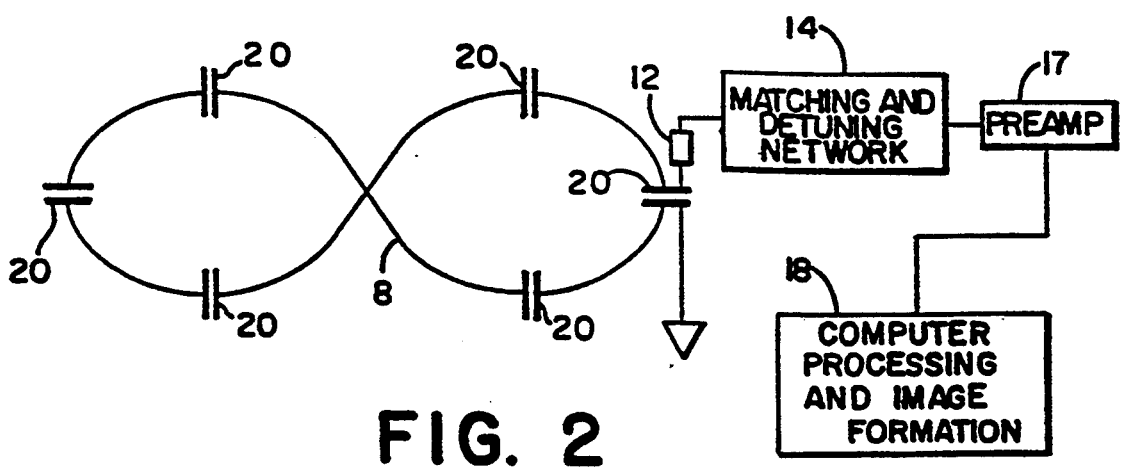
FIG. 2

FLEXIBLE SURFACE COILS FOR USE IN NUCLEAR MAGNETIC RESONANCE IMAGING

This is a continuation of application Ser. No. 07/854,798 now abandoned, filed Mar. 23, 1992, which is a continuation of Ser. No. 07/618,527 now abandoned, filed Nov. 26, 1990, which is a continuation of Ser. No. 07/477,182 now abandoned, filed Feb. 5, 1990, which is a continuation of Ser. No. 07/242,479 now abandoned, filed Sep. 9, 1988.

FIELD OF THE INVENTION

This application relates to novel coils for use in nuclear magnetic resonance (NMR) imaging. More specifically, this application relates to novel coils for use in NMR that are flexible and that conform to a patient's anatomy in a comfortable fashion.

BACKGROUND OF THE INVENTION

Nuclear magnetic resonance imaging has been used in the medical art for some time as a clinical tool for diagnosis of the diseases and maladies that affect the human body. In many applications, NMR imaging is considered by those skilled in the art as the method of choice over other types of imaging methods such as "X-Ray" imaging or acoustical imaging. NMR imaging provides a non-invasive and efficient method of imaging certain areas of a patient's body in certain applications.

The NMR technique is well known. The sample to be imaged is subjected to an external magnetic field, $B_0$. Since the human body is primarily composed of water, the protons in the water molecules align themselves with the external magnetic field. The protons have magnetic dipole moments and possess spin quantum numbers with multiplicity of $\frac{1}{2}$. An alternating magnetic field is applied to the system with frequency $w_0$ which is close to the Larmor frequency of the protons. Due to the spin quantum numbers associated with the protons, they will resonate at the frequency of the alternating field. Resonance occurs since the alternating magnetic field tends to force the protons to oscillate around the direction of the field lines of the external magnetic field, $B_0$, in an effort to realign with the;external magnetic field. During oscillation the protons emit radio frequency (rf) signals which are termed "NMR signals".

The NMR phenomenon can be viewed as a splitting of nuclear Zeeman sublevels due to the multiplicity of allowed spin quantum numbers among the protons. Strong oscillation occurs at the resonant frequency, $w_0$, which can be detected if a suitable receiving mechanism is placed on or near the sample which is under examination. Generally, a coil is used to receive the signals from the sample as it undergoes oscillation. There has been great interest in the NMR art to design improved coils for high resolution imaging of all of the desired areas of the human body. An important motivating factor in NMR coil design has also been to ensure ease of use coupled with a high degree of patient comfort.

In the past, coils have been designed with a high degree of stiffness. Typically, the NMR coil is viewed as an antenna system with a plurality of coil elements comprising the system. Such an arrangement is embodied for example in U.S. Pat. No. 4,620,155 to Edelstein. The coil arrangement in Edelstein is of necessity configured as a rigid body. Similarly, in U.S. Pat. No. 4,649,348 to Flugan, a receiving coil for use in NMR imaging is constructed which, while having a high quality factor (Q), suffers from a poor signal to noise ratio (SNR). Other examples of rigid surface coils are exemplified in U.S. Pat. No. 4,692,705 to Hayes wherein embodiments of coils comprising a plurality of conductive segments and capacitive or inductive elements are illustrated. These types of coils are necessarily rigid, are usable only for very specific applications, and provide little opportunity for use in diversified areas. They do not satisfy the long felt need in the NMR art for coils which can be conformed to the same areas of different patients since the human anatomy can differ greatly in size from patient to patient. Thus, these coils cannot attain a consistently high SNR and provide ease of use and patient comfort.

It has been known in the NMR art that the closer the coil is to the sample or area of interest the better the image obtained. This occurs, in part, since the closer the coil is to the sample, the higher the SNR of the received electromagnetic signal. Thus, it has been generally known in the art to produce surface coils for NMR imaging of the human body as evidenced by the teachings of J. F. Schenck et al. in an article entitled "High Resolution Magnetic Resonance Imaging Using Surface Coils," *Magnetic Resonance Annual*, p 123 (1986) A "surface coil" is understood by those skilled in the art to be an NMR coil which is placed either directly on, or very close to, the area of the patient which will be imaged.

Considerable effort has gone into improving the SNR of NMR surface coils. It has been desired to create NMR surface coils that produce a consistently high SNR for all applications and clinical situations. However, this has heretofore not been achieved in the NMR coil art. Rigid, nonconforming surface coils are unable to achieve this desirable result since they cannot be placed close enough to the examination area to eliminate extraneous electromagnetic noise. Extraneous electromagnetic noise comes from the patient's own thermal radiation and various species of chemicals present in the patient which are responsive to the different magnetic fields applied during the NMR procedure.

NMR coils which attempt to bring the sample area close to the coil itself have been utilized so that a higher SNR can be achieved. Examples of such coils can be found in U.S. Pat. No. 4,680,549 to Tanttu and U.S. Pat. No. 4,587,493 to Sepponen, for example. The coil arrangement embodied in Sepponen cannot fairly be characterized as a "surface coil" since, rather than placing the coil near to the patient, the coil's Volume is modified to surround the area of the patient's anatomy which will be imaged. Such an arrangement is cumbersome and is strictly limited by the maximum volume achievable with the coil. Similarly, the physical dimensions of the coil arrangement in Tanttu severely limit its ability to be placed near enough to the patient's body to achieve a high SNR. Accordingly, there has been a long felt need in the art for surface coils which can be placed directly on the surface area of the patient's anatomy to be imaged so as to achieve a high SNR. This need has not been fulfilled by any known prior art coil.

Various coils have been utilized which attempt to solve the problem of extraneous electromagnetic noise. In general, surface coils which have some degree of flexibility in parts of their elements allow the coils to conform to a certain extent to the area of examination. An example of this type of coil is disclosed in U.S. Pat. No. 4,398,149 to Zens. Zens discloses therein that the coils may be printed on flexible insulating materials.

Similarly, in U.S. Pat. No. 4,646,024, Schenck et al. disclose that NMR coils can be disposed on a flexible printed circuit board material which is then wrapped around a coil of appropriate diameter to form the apparatus. However, neither of the inventions embodied in these two patents satisfy the long felt need for flexible conforming surface coils with a high SNR. Although the coils described in both of these patents are printed on circuit boards comprised of electrically insulating materials which are somewhat flexible, their degree of flexibility is substantially less than necessary to provide the ability for these coils to completely conform to the area of the patient's anatomy which will be imaged. Furthermore, the coils disclosed in the Schenck et al patent are in fact rigid since the flexible circuit board material is wrapped around a stiff cylinder to complete the coil apparatus. Thus, neither of the coils embodied in the patents to Zens and Schenck et al satisfy the long felt need in the NMR art for surface coils which closely conform to a patient's anatomy and which can be used interchangeably among patients whose anatomies vary in size.

U.S. Pat. No. 4,636,730 to Bottomley relates to other coils which are positioned on relatively flexible substrates to allow conformity to the sample to be investigated. In particular Bottomley discloses a flexible insulative substrate which forms the body of a printed circuit board upon which the NMR coil is constructed, thereby giving the coil some ability to conform to the sample to be imaged. As with the Zens and Schenck et al. coils, Bottomley discloses relatively thin surface coils which have been constructed on printed circuit boards having some degree of flexibility associated with the substrate material. However the device embodied in the Bottomley patent does not fulfill the long felt need in the NMR coil art for surface coils which are adjustable for a multitude of patients and which closely conform to a patient's anatomy thereby allowing formation of an image having a high SNR, for the surface coils disclosed by Bottomley are only partially conforming since they are also formed on printed circuit boards having only a modest degree of flexibility.

The various inventions embodied in the above-cited patents fail to provide NMR surface coils which are highly flexible and conforming. However, in U.S. Pat. No. 4,617,936 Malko discloses flexible surface coils for use in magnetic resonance imaging which are comprised of an electrically insulating flexible tube which is filled with liquid mercury. The liquid mercury within the flexible tube detects the resonant signals from the area of the patient's body which is under observation since mercury is electrically conductive. However, the coils embodied in the Malko patent have several serious disadvantages. In particular, the use of liquid mercury as a conductive element to receive the resonant signals from the patient is dangerous since mercury is highly toxic. Thus, should the insulating tube rupture, the patient would be exposed to poisonous mercury immediately adjacent to a potentially vital area of his anatomy. Moreover, regardless of the type of conducting liquid used, a slow leak would significantly reduce the ability of the coil to detect the resonant signals from the patient. Additionally, the coils disclosed by Malko do not fully conform to the area of the patient's anatomy to be imaged since the tube can only be loosely wrapped around the desired area.

All of the NMR coils embodied in the aforementioned patents produce low quality images due to the existence of artifacts and aliasing. "Artifacts" are signals which are detected by the coil but have sources from other than those particular areas of the patient which are under observation. Since the coils described above cannot truly conform to the particular area of the patient under observation, they detect significant artifacts from parts of the patient's body which are not of interest. On the other hand "aliasing" is a phenomenon which exists in all forms of electromagnetic signal detection and processing. Generally, aliasing (sometimes referred to as "foldover and aliasing") takes place when a continuous signal that is not bandlimited is detected by an NMR coil such as those described. Thus, images from features outside the field of view (FOV) of the coil are superimposed upon features within the FOV of the coil. Aliasing occurs when high frequency signals foldover into the frequency region of interest and masquerade as the low frequency signals of interest. All of the coils described above exhibit a large degree of aliasing since they are not able to closely conform to the area of interest and thus detect signals emanating from areas outside of the desired FOV of the coil. Aliasing contributes to low quality resolution by distorting the images of the area of the patient under observation.

There is thus a long felt but unfulfilled need in the magnetic resonance imaging art for flexible surface coils. This long felt need requires coils which can closely conform to the patient's body and which reduce the detection of artifacts and limit distortion due to aliasing. An additional long felt need exists in the art for surface coils which have a high SNR and that can be placed directly on the area of the patient which is to be imaged. It is desirable that such coils be constructed of flexible materials that are able to closely conform to a specified area of a patient's anatomy and provide a high degree of comfort to the patient. NMR coils which would fulfill these needs should be adjustable so that patients whose anatomies vary in size can be imaged with the same coil. Similarly, a long felt need in the art exists for flexible, conforming surface coils which are usable with existing NMR magnets and support systems to ensure efficiency and economy.

SUMMARY OF THE INVENTION

Flexible, conforming surface coils in accordance with this invention are viewed as providing superior images in nuclear magnetic resonance imaging. It has not been known heretofore in the NMR imaging art to construct NMR coils out of electrically conductive materials embedded in flexible, conforming bodies which are permeable to electromagnetic radiation.

In accordance with this invention, there are provided surface coils for use in nuclear magnetic resonance. Preferably, these coils comprise a flexible outer surface body and means disposed within the flexible outer bodies for receiving electromagnetic signals. In preferred embodiments, means for holding the surface coil at a specified area of a patient is attached to the flexible outer body means. It is also generally desired to provide means for relaying the electromagnetic signal from the means for receiving electromagnetic signals through the flexible outer body means.

In accordance with an embodiment of this invention there are provided flexible, conforming surface coils for high resolution nuclear magnetic resonance imaging of a patient's orbits. In preferred embodiments, these coils comprise a mask having spaces to receive the patient's orbits. Preferably, means for receiving electromagnetic signals are disposed within the mask and means for relaying the electromagnetic signals to matching and detuning means interfaced with the means for receiving electromagnetic signals are provided. It is also desired to provide means for securing the flexible, conforming surface coils to the patient's orbits.

In accordance with another embodiment of this invention, there are also provided flexible, conforming surface coils for nuclear magnetic resonance imaging of a patient's neck. In preferred embodiments, these coils comprise first and second half shells and a hinge attached to the first and second half shells such that the flexible, conforming coil can be closed by bringing the first and second half shells together and opened by separating the first and second half shells. In further preferred embodiments, means for receiving electromagnetic signals are disposed within the first and second half shells. Preferably, means for relaying the electromagnetic signals to matching and detuning means from the means for receiving electromagnetic signals are also provided.

A wide variety of areas of a patient's anatomy can be imaged with the coils described in accordance with this invention. Thus, preferred embodiments of such flexible, conforming surface coils are thought to be generally useful for high resolution nuclear magnetic resonance imaging of all of the desired areas of a patient's anatomy.

It is an object of the present invention to provide flexible surface coils for high resolution imaging of a patient's anatomy.

It is another object of the present invention to provide flexible surface coils which will closely conform to the area of the patient's anatomy which is under observation.

It is yet another object of the present invention to provide flexible, conforming surface coils which are adjustable to conform to the patient's anatomy.

It is still another object of the present invention to provide adjustable, flexible, conforming surface coils which are usable with a variety of patients having different sized anatomies.

It is still another object of the present invention to provide flexible, conforming surface coils which give the patient a high degree of comfort.

It is still another object of the present invention to provide flexible, conforming surface coils which give high resolution images of a desired area of a patient's anatomy.

It is still another object of the present invention to provide flexible, conforming surface coils which can be utilized with preexisting NMR magnets and support equipment.

It is still another object of the present invention to provide flexible, conforming surface coils for high resolution imaging of a patient's orbits.

It is still another object of the present invention to provide flexible, conforming surface coils for high resolution imaging of a patient's neck.

The foregoing and other objects and advantages of the present invention herein described will be better understood from the following detailed description and appended claims.

BRIEF DESCRIPTION OF THE DRAWINGS

FIG. 1 shows in cross section a preferred embodiment of a flexible, conforming surface coil for NMR imaging of a patient's orbits.

FIG. 1A is a side view of the flexible, conforming surface coil of FIG. 1.

FIG. 2 is a circuit diagram of a preferred embodiment of an antennae disposed for detecting NMR signals within the coil of FIG. 1.

DETAILED DESCRIPTION OF THE PREFERRED EMBODIMENTS

Figure 3:
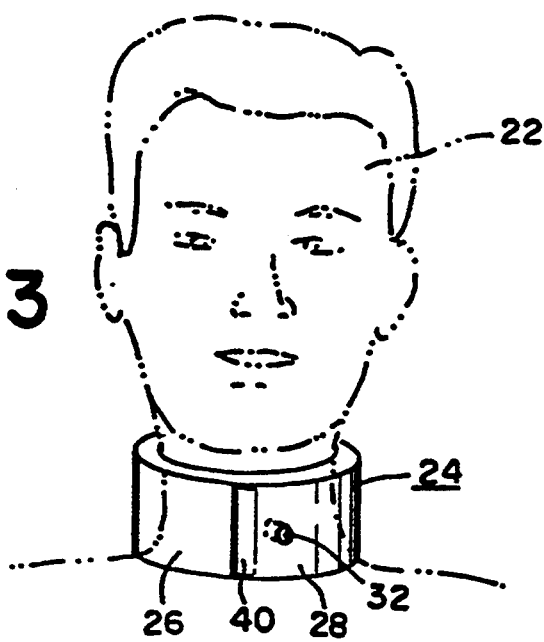
FIG. 3 is a preferred embodiment of a flexible, conforming surface coil for NMR imaging of a patient's neck.

The present invention is directed to flexible, conforming surface coils for use in nuclear magnetic resonance imaging. In preferred embodiments, the coils are comprised of a flexible outer body. Materials which are useful for construction of the flexible outer body are best described by what they do rather than by what they are. Thus, materials which are flexible, can conform to irregular shaped areas of a patient's anatomy and are permeable to electromagnetic radiation in the rf range are generally useful. Examples of such materials are members of the polyurethane family, polyvinylchloride family and other families. The flexible outer body means are selected so as to be able to conform to the surface of the patient's anatomy that will be imaged. "Conforming" is used herein to mean that the coil closely adopts the shape and contours of the area under observation when it is placed adjacent to that area.

It is generally desired to dispose antennae within the flexible outer body. The antennae are preferably also flexible so that they can conform to the shape of the flexible outer body. For example, electrical conductors such as malleable copper, silver, gold, aluminum or other electrical conductors may be used.

Straps for holding the surface coil against a specified area of a patient's anatomy are preferably provided. In further preferred embodiments, the straps for holding the surface coil to a specified area of a patient's anatomy are attached to the flexible outer body. In still further preferred embodiments, the straps for holding the surface coil against a specified area of a patient's anatomy are comprised of a pair of straps which may be restrained against one another by, for example, VELCRO ®.

In a preferred embodiment, a connector for relaying the electromagnetic signal from the coil is provided. The connector for relaying electromagnetic signals is connected through the flexible outer body with the antennae. It is then generally desired to process the electromagnetic signal which has been relayed to obtain highly resolved images of the particular area of the patient under observation.

The antennae are further comprised of a plurality of electrically conductive elements. It is generally desired to provide a plurality of capacitors coupled to the plurality of conductive elements so that the coil can be tuned to a desired frequency. "Tuning" as used herein means choosing the capacitance value of the capacitors such that the coil will detect a predetermined resonant frequency.

In accordance with this invention, flexible, conforming surface coils for high resolution imaging of a patient's orbits are disclosed. A patient's "orbits" are generally known by those skilled in the art to be the area of the patient's anatomy which comprise the eyes and supporting tissue and structure which house the eyes. In a preferred embodiment, flexible, conforming surface coils for imaging a patient's orbits are comprised of a mask having spaces to receive the patient's orbits. It is desired to construct the mask out of a flexible material which is permeable to electromagnetic radiation in the rf range such as, for example, polyurethane, polyvinylchloride and others so that the coil can closely conform to the patient's head.

In a preferred embodiment, antennae are provided and are disposed within the mask. The antennae are flexible so that they conform to the shape of the mask. The antennae are further comprised of a plurality of conductive elements and a plurality of capacitor coupled to the plurality of conductive elements. In more preferred embodiments, straps for securing the flexible, conforming surface coils are provided coupled to the mask.

Flexible conforming surface coils for nuclear magnetic resonance imaging of a patient's neck are also provided in accordance with this invention. Preferably, these coils comprise first and second half shells constructed of a flexible, conforming material. In a preferred embodiment, a hinge is attached to the first and second half shells such that the flexible, conforming coils can be closed by bringing the first and second half shells together and opened by separating the first and second half shells. Antennae disposed within the first and second half shells are also provided. In a preferred embodiment, a connector for relaying the electromagnetic signal to an external device are connected with the antennae.

In FIG. 1, a preferred embodiment of a flexible conforming surface coil for high resolution imaging of a patient's orbits is shown in cross-section. Coil 2 is placed around the patient's head shown generally at 4. The coil 2 is comprised of mask 6 which is made of a flexible material such as polyurethane, polyvinylchloride or other materials, and a receiving antenna 8 therein which is also flexible and conforming. Antennae 8 is constructed from a flexible, conforming electrically conductive material such as gold, copper, silver or aluminum and receives NMR signals emitted from the patient's orbits.

The coil has spaces 10 for receiving the patient's orbits. Since both mask 6 and antennae 8 are comprised of flexible, conforming materials, coil 2 substantially adopts the contours and shape of the patient's head. Furthermore, since the coil is flexible and conforming it can be used on a variety of patient's with different sized heads. Thus, the flexible, conforming surface coil of FIG. 1 satisfies a long felt need in the art for coils which are interchangeable among patient's with differing sized anatomies and which closely conform to a patient's anatomy to produce highly resolved images without appreciable aliasing or detection of artifacts. Coil 2 also provides a high degree of patient comfort.

In FIG. 1A, a side view of a flexible, conforming surface coil for imaging a patient's orbits is shown. In this view, antennae 8 is disposed within the flexible, conforming material of mask 6. Connector 12 connects antennae 8 through mask 6 to matching and detuning network 14. Connector 12 thus provides an electrical relay of the NMR signal between antennae 8 and matching and detuning network 14. Securing strap (or straps) 16 is mechanically coupled to mask 6. In preferred embodiments, securing strap 16 is actually two straps connectable by VELCRO ®. Mask 6 is thus adjustable so as to permit the coil to fit patients with different sized heads.

The NMR coil for imaging a patient's orbits satisfies a long felt need in the art for NMR coils which are usable with a variety of patients. Furthermore, this coil provides high resolution images of the patient's orbits in an economical fashion since it can be utilized with pre-existing NMR magnets and support equipment. This type of coil also provides a high degree of comfort to the patient since the mask is lightweight and conforms easily to the patient's anatomy. By placing the coil directly on the area of interest, the images obtained are highly resolved and free of distortions.

FIG. 2 is a circuit diagram of a preferred embodiment of antennae 8. As shown, antenna 8 is a butterfly design with six distributed capacitors 20. In practice, any type of antennae design is useful. In fact, a plurality of antennas may be disposed within the mask giving the coil the ability to be utilized in different applications for an area of the patient by merely switching between the various antennas in the mask. Connector 12 may be modified to act as a switch between a plurality of antennas disposed within the mask. Matching and detuning network 14 is coupled through connector 12 to antennae 8.

Generally, it is desired to couple the antennae to matching and detuning network 14 which is in turn interfaced with a computer processing device 18. Matching and detuning network 14 is an electronic network comprising inductive or capacitive elements which to minimize resistive losses in the electromagnetic signal as it is relayed for image formation and either a passive or active diode network which detunes the coil during transmission of the rf pulse. The matching and detuning network 14 can either be inductively driven or driven with a conventional series or parallel arrangement of capacitors. The NMR signal from antennae 8 which has been matched and detuned is then input to preamplifier 17. A highly resolved image is obtained after computer processing 18 occurs at computer processing and image formation circuitry 18. Computer processing and image formation takes place according to techniques which are well known to those skilled in the art.

FIG. 3 illustrates a preferred embodiment of a flexible, conforming surface coil for magnetic resonance imaging of a patient's neck. The patient, shown generally at 22, has a flexible, conforming coil 24 securely fastened around his neck. Coil 24 is comprised of a first half shell 26 and a second half shell 28. Half shells 26 and 28 are comprised of a flexible, conforming material which is permeable to electromagnetic radiation in the rf range, for example, polyurethane, polyvinylchloride and others.

Figure 3A:
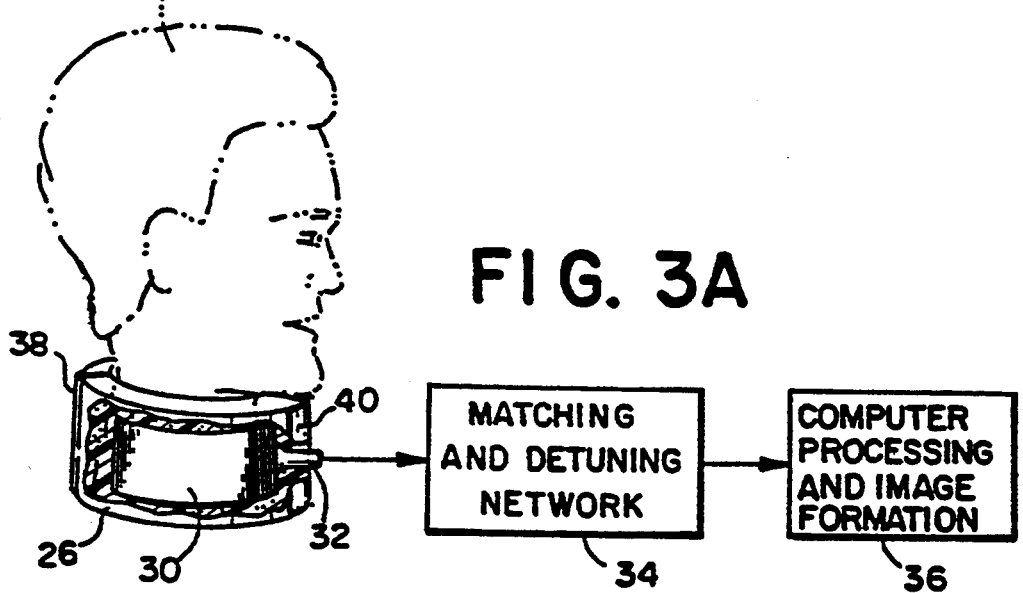
FIG. 3A is a side view of the flexible, conforming surface coil of FIG. 3.

FIG. 3A is a side view of coil 24 exposing the first half shell 26. An antennae 30 is disposed within first half shell 26 and receives NMR signals from the patient's neck. In a similar fashion, second half shell 28 also contains an antennae (not shown) which is electrically connected to antennae 30. Both of the antennas in the first and second half shells are constructed from a flexible, conforming electrically conductive material so that when coil 24 is secured, it substantially adopts the contours and shape of the patient's neck.

As with the flexible conforming surface coil for imaging a patient's orbits, the flexible conforming surface coil for imaging a patient's neck may also have a number of different antennas embedded within the first and second half shells. Thus, it would be possible to place various antennas for different applications within one coil thereby expanding the utility of the coil for different applications.

Connector 32 is connected to antennae 30 through first half shell 26. Additionally, connector 32 is connected to matching and detuning network 34 so that NMR signals can be prepared for computer processing and image formation by computer 36. Computer processing and image formation computer 36 processes the received signals according to techniques which are well known to those skilled in the art.

Figure 4:
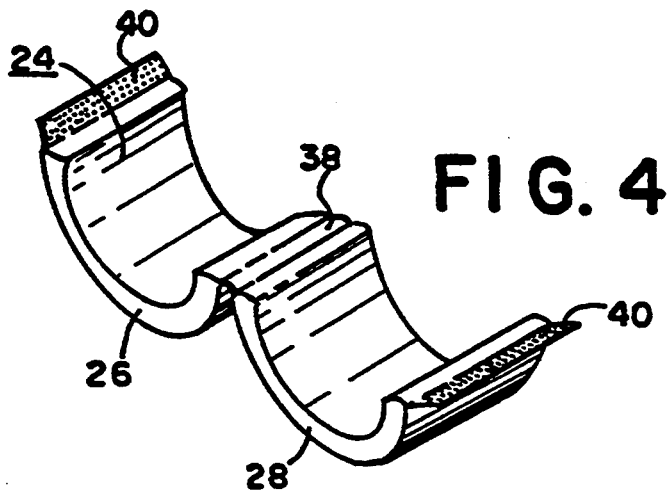
FIG. 4 is an illustration of the flexible, conforming surface coil of FIG. 3 in the "open" position.

In FIG. 4, flexible, conforming surface coil 24 is shown in the open position. Hinge 38 is fastened to both first half shell 26 and second half shell 28 such that coil 24 can be opened and closed around the patient's neck. Hinge 38 may be adapted so that coil 24 can accommodate patients with different sized necks. Hinge 38 may be constructed of a light weight and resilient material, for example plastic, and may be adapted to provide support for the weight of coil 24. In preferred embodiments, it is generally desired to provide fastening panels 40 attached to both first half shell 26 and second half shell 28 so that when coil 24 is in the closed position it is held securely about the patient's neck. The fastening panels may be provided with strips of VELCRO ® so that they can be firmly secured.

Coil 24 fulfills a long felt need in the art for a flexible, conforming surface coil for magnetic resonance imaging of a patient's neck. Since coil 24 closely adopts the shapes and contours of patients with different sized necks, it is able to produce high resolution images without detecting artifacts and with no appreciable aliasing. Furthermore, coil 24 can be utilized with preexisting NMR magnets and ancillary support equipment thus allowing efficient and economical magnetic resonance imaging. Coil 24 also provides patient comfort.

There have thus been described certain preferred embodiments of flexible, conforming surface coils for use in nuclear magnetic resonance imaging. These coils satisfy a long felt need in the art for coils which provide a high degree of patient comfort, are usable among patients with different sized anatomies, have a high SNR and produce highly resolved images since they minimize detection of artifacts and distortion due to aliasing. While preferred embodiments have been described and disclosed, it will be recognized by those with skill in the art that modifications are within the spirit and scope of the invention. The disclosed embodiments and appended claims are intended to cover all such modifications.

What is claimed is:

1. A coil assembly for detecting electromagnetic radiation emitted from a patient, comprising:
    a flexible outer body portion which conforms to the contours of an area of the patient's anatomy and is permeable to electromagnetic radiation emitted from the patient;
    a flexible coil disposed within said flexible outer body portion for receiving electromagnetic radiation emitted from the patient, said flexible coil also conforming to the contours of said area of the patient's anatomy;
    means for holding said flexible outer body portion and coil against said area of the patient's anatomy; and
    means for connecting said coil through said flexible outer body portion so as to relay a signal representing received electromagnetic radiation to an exterior of said flexible outer body portion,
    wherein said flexible outer body portion has a shape which conforms to a patient's neck region, and comprises a pair of flexible half shells connected by a hinge so as to accommodate patients having necks of different sizes.

2. A coil assembly as in claim 1, wherein said coil comprises at least one of copper, silver, gold and aluminum.

3. A coil assembly as in claim 1, wherein said coil further comprises a plurality of capacitors for tuning said coil to a desired frequency.

4. A coil assembly as in claim 1, wherein said means for holding comprises at least one adjustable securing strap.

5. A coil assembly as in claim 1, wherein said holding means comprises fastening panels which fasten together to close said flexible half shells.

6. A coil assembly as in claim 1, wherein said hinge is made of plastic.

7. A coil assembly as in claim 1, wherein said flexible outer body portion is formed of at least one of polyurethane and polyvinylchloride.

8. A coil assembly for detecting electromagnetic radiation emitted from a patient, comprising:
    a flexible outer body portion which conforms to the contours of the neck of a patient and is permeable to electromagnetic radiation emitted from the patient;
    a flexible coil disposed within said flexible outer body portion for receiving electromagnetic radiation emitted from the neck of the patient, said flexible coil also conforming to the contours of the neck of the patient;
    means for holding said flexible outer body portion and coil about the neck of the patient; and
    means for connecting said coil through said flexible outer body portion so as to relay a signal representing received electromagnetic radiation to an exterior of said flexible outer body portion;
    wherein said flexible outer body portion comprises a pair of flexible half shells connected by a hinge so as to accommodate patients having necks of different sizes.

9. A coil assembly as in claim 8, wherein said holding means comprises fastening panels which fasten together to close said flexible half shells.

10. A coil assembly as in claim 8, wherein said hinge is made of plastic.

11. A coil assembly as in claim 8, wherein said coil further comprises a plurality of capacitors for tuning said coil to a desired frequency.

12. A coil assembly as in claim 8, wherein said flexible outer body portion is formed of at least one of polyurethane and polyvinylchloride.

13. A coil as in claim 8, wherein said coil comprises at least one of copper, silver, gold, and aluminum.

* * * * *